(12) United States Patent
Song et al.

(10) Patent No.: US 9,240,408 B2
(45) Date of Patent: Jan. 19, 2016

(54) INTEGRATED CIRCUIT DEVICE WITH TRANSISTORS HAVING DIFFERENT THRESHOLD VOLTAGES

(71) Applicant: Samsung Electronics Co., Ltd., Suwon-si, Gyeonggi-do (KR)

(72) Inventors: Seung-Hyun Song, Hwasung-si (KR); Seung-Chul Lee, Seongnam-si (KR); In-Kook Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1 day.

(21) Appl. No.: 13/838,172

(22) Filed: Mar. 15, 2013

(65) Prior Publication Data

US 2013/0328133 A1 Dec. 12, 2013

(30) Foreign Application Priority Data

Jun. 11, 2012 (KR) .................. 10-2012-0062232

(51) Int. Cl.
*H01L 21/82* (2006.01)
*H01L 27/11* (2006.01)
*H01L 27/088* (2006.01)
*H01L 21/8234* (2006.01)

(52) U.S. Cl.
CPC ...... *H01L 27/088* (2013.01); *H01L 21/823412* (2013.01)

(58) Field of Classification Search
CPC ............... H01L 21/823462; H01L 21/105; H01L 21/823857; H01L 27/11; H01L 27/088
USPC ....................................................... 257/392
See application file for complete search history.

(56) References Cited

U.S. PATENT DOCUMENTS

| | | | |
|---|---|---|---|
| 5,147,811 A | 9/1992 | Sakagami | |
| 7,119,404 B2 | 10/2006 | Chang et al. | |
| 7,655,984 B2 | 2/2010 | Chen et al. | |
| 7,718,496 B2 | 5/2010 | Frank et al. | |
| 7,985,988 B2 | 7/2011 | Yoshida et al. | |
| 2006/0024879 A1 | 2/2006 | Fu et al. | |
| 2007/0254444 A1* | 11/2007 | Bloomquist et al. | 438/305 |
| 2008/0116487 A1* | 5/2008 | Lee | H01L 21/2683 257/194 |
| 2009/0321850 A1* | 12/2009 | Griebenow et al. | 257/392 |
| 2010/0237425 A1 | 9/2010 | Chan et al. | |
| 2012/0146147 A1* | 6/2012 | Hook | H01L 21/84 257/351 |

FOREIGN PATENT DOCUMENTS

| | | |
|---|---|---|
| JP | 3256122 B2 | 11/2001 |
| JP | 2002-368080 A | 12/2002 |
| JP | 2009-278031 A | 11/2009 |
| KR | 10-0903483 B1 | 6/2009 |
| KR | 10-2011-0002978 A | 1/2011 |
| KR | 10-1093141 B1 | 12/2011 |

* cited by examiner

*Primary Examiner* — Monica D Harrison
(74) *Attorney, Agent, or Firm* — Myers Bigel Sibley & Sajovec, P.A.

(57) ABSTRACT

Integrated circuit device with transistors having different threshold voltages and methods of forming the device are provided. The device may include the first, second and third transistors having threshold voltages different from each other. The first transistor may be free of a stacking fault and the second transistor may include a stacking fault. The concentration of the channel implant region of the third transistor may be different from the concentration of the channel implant region of the first transistor.

20 Claims, 14 Drawing Sheets

INTEGRATED CIRCUIT DEVICE WITH TRANSISTORS HAVING DIFFERENT THRESHOLD VOLTAGES

This U.S. non-provisional application claims priority under 35 U.S.C. §119 to Korean Patent Application No. 10-2012-0062232, filed on Jun. 11, 2012, in the Korean Intellectual Property Office, the disclosure of which is herein incorporated by reference in its entirety.

FIELD

The present disclosure generally relates to the field of electronics, and particularly semiconductor devices.

BACKGROUND

Process induced strain may be used to enhance the carrier mobility in short channel devices by applying stress to the channel regions. A stress memorization technique has been developed to implement the process induced strain.

SUMMARY

A semiconductor device may include a first transistor of a first conductivity type, which may be free of a stacking fault, on a substrate. The semiconductor device may further include a second transistor of the first conductivity type, which may include a stacking fault, on the substrate. The semiconductor device may also include a third transistor of the first conductivity type on the substrate and a concentration of a channel implant region of the third transistor may be different from a concentration of a channel implant region of the first transistor.

According to various embodiments, the third transistor may include a stacking fault.

In various embodiments, the concentration of the channel implant region of the first transistor may be greater than the concentration of the channel implant region of the third transistor.

According to various embodiments, a concentration of a channel implant region of the second transistor may be equal to or less than the concentration of the channel implant region of the first transistor.

In various embodiments, a concentration of a halo of the first transistor may be different from a concentration of a halo of the third transistor.

According to various embodiments, the concentration of the halo of the first transistor may be greater than the concentration of the halo of the third transistor.

In various embodiments, a concentration of a halo of the second transistor may be equal to or less than the concentration of the halo of the first transistor.

According to various embodiments, the first, second and third transistors may include first, second and third gate electrodes respectively, and a length of the first gate electrode may be different from a length of the third gate electrode.

In various embodiments, the length of the first gate electrode may be greater than the length of the third gate electrode.

According to various embodiments, a length of the second gate electrode may be equal to or less than the length of the first gate electrode.

In various embodiments, the first transistor, the second transistor, and the third transistor may have threshold voltages different from each other.

According to various embodiments, a threshold voltage of the first transistor may be higher than a threshold voltage of the second transistor, which may be higher than a threshold voltage of the third transistor.

A semiconductor device may include a first transistor of a first conductivity type, which may be free of a stacking fault, on a substrate. The semiconductor device may further include a second transistor of the first conductivity type, which may include a stacking fault, on the substrate. The semiconductor device may also include a third transistor of the first conductivity type on the substrate and a concentration of a halo of the third transistor may be different from a concentration of a halo of the first transistor.

According to various embodiments, the concentration of the halo of the first transistor may be greater than the concentration of the halo of the third transistor.

In various embodiments, a concentration of a halo of the second transistor may be equal to or less than the concentration of the halo of the first transistor.

A method of forming an integrated circuit device may include forming a first mask pattern on a substrate including first, second, and third regions and implanting impurities into the first and second regions using the first mask pattern to form channel implant regions in the first and second regions. The first mask pattern may expose the first and second regions while covering the third region. The method may further include forming first, second and third gate structures in the first, second, and third regions, respectively and forming a second mask pattern, which may expose the second and third regions while covering the first region, on the substrate. The method may also include implanting ions into the second and third regions using the second mask pattern to form amorphous regions in the substrate adjacent sides of the second and third gate structures and forming a stress film on the first, second and third gate structures. Moreover, the method may include performing a heat treatment process to form stacking faults in the amorphous regions in the substrate adjacent the sides of the second and third gate structures.

According to various embodiments, the method additionally include forming an intervening pattern on the first gate structure prior to forming the stress film in the first region and the intervening pattern may cover the first gate structure while exposing the second and third gate structures.

In various embodiments, the method may further include comprising removing the stress film on the first gate structure before performing the heat treatment process.

According to various embodiments, the method may also include forming a third mask pattern, which may expose the third region while covering the first and second regions, on the substrate and implanting impurities into the third region using the third mask pattern to form a channel implant region in the third region. A concentration of the channel implant region in the first region may be greater than a concentration of the channel implant region in the third region.

In various embodiments, forming the first, second and third gate structures may include forming first, second and third gate electrodes of the first, second and third gate structures respectively, and a length of the first gate electrode may be greater than a length of the third gate electrode.

DETAILED DESCRIPTION

Figure 1:
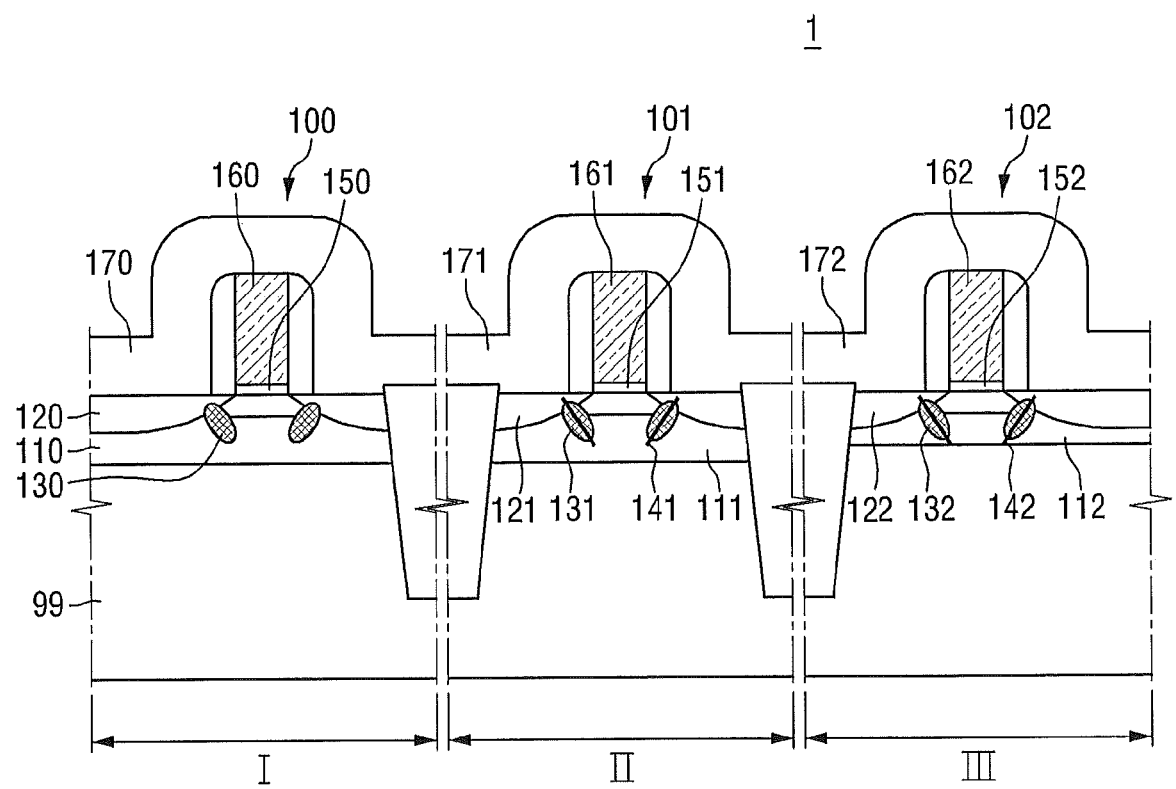
FIG. 1 is a cross-sectional view of a semiconductor device according to some embodiments of the present inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

FIG. 1 is a cross-sectional view of a semiconductor device according to some embodiments of the present inventive concept.

Referring to FIG. 1, the semiconductor device 1 includes a first transistor 100, a second transistor 101, and a third transistor 102. The first through third transistors 100 through 102 may be transistors of the same conductivity type (e.g., an n type). A first region I, a second region II, and a third region III are defined in a substrate 99, and the first through third transistors 100 through 102 may be disposed in the first through third regions I through III, respectively.

The substrate 99 may be a rigid substrate such as a silicon-on-insulator (SOI) substrate, a gallium arsenide substrate, a silicon germanium substrate, a ceramic substrate, a quartz substrate or a glass substrate for displays or may be a flexible plastic substrate such as polyimide, polyester, polycarbonate, polyethersulfone, polymethylmethacrylate, polyethylene naphthalate or polyethyleneterephthalate.

The first transistor 100 may include a first channel implant region 110, a first source/drain 120, a first halo 130, a first gate insulating film 150, a first gate electrode 160 and a first stress film 170.

The second transistor 101 may include a second channel implant region 111, a second source/drain 121, a second halo 131, a second stacking fault 141, a second gate insulating film 151, a second gate electrode 161 and a second stress film 171.

The third transistor 102 may include a third channel implant region 112, a third source/drain 122, a third halo 132, a third stacking fault 142, a third gate insulating film 152, a third gate electrode 162 and a third stress film 172.

Each of the first through third gate electrodes 160 through 162 may be, but is not limited to, a single film of poly-Si, poly-SiGe, poly-Si doped with impurities, metal such as Ta, TaN, TaSiN, TiN, Mo, Ru, Ni or NiSi, or metal silicide, or a stacked film of these materials.

Each of the first through third gate insulating films 150 through 152 may be made of a silicon oxide film, a silicon nitride film, SiON, $Ge_xO_yN_z$, $Ge_xSi_yO_z$, a high-k material, a combination of these materials, or a sequential stack of these materials. Examples of the high-k material may include, but not limited to, $HfO_2$, $ZrO_2$, $Al_2O_3$, $Ta_2O_5$, hafnium silicate, zirconium silicate, and a combined film of these materials.

The first through third transistors 100 through 102 may have the same conductivity type and the first through third sources/drains 120 through 122 may be doped with impurities of the same conductivity type. When the first through third transistors 100 through 102 are n-type transistors, the first through third sources/drains 120 through 122 may include, for example, As.

Each of the first through third stress films 170 through 172 may be a silicon nitride, silicon oxide, or silicon oxynitride film. For example, when each of the first through third stress films 170 through 172 is a SiN film, it may apply tensile stress or compressive stress according to a ratio of N—H bonding to Si—H bonding in the SiN film. For example, if the ratio of the N—H bonding to Si—H bonding is approximately 1 to 5, tensile stress may be applied. If the ratio of N—H bonding to Si—H bonding is approximately 5 to 20, compressive stress may be applied.

While no stacking fault is formed in the first transistor 100, the second stacking fault 141 may be formed in the second transistor 102, and the third stacking fault 142 may be formed in the third stacking transistor 102. The second stacking fault 141 may be the same size as the third stacking fault 142. The second stacking fault 141 and the third stacking fault 142 may be formed by the same process. Here, the phrase "the same size" may denote not only exactly the same size but also the same size with an allowable difference which may occur during a process.

The second and third stacking faults 141 and 142 may be formed by a stress memorization technique (SMT) process. That is, the second and third stacking faults 141 and 142 may be formed by amorphizing portions of the substrate 99 using a pre-amorphization implantation (PAI) process and then recrystallizing the amorphized portions using a thermal process after forming the first through third stress films 170 through 172. During the process of recrystallizing amorphous regions, the position of an atomic layer in the amorphous regions may be changed, or portions of the atomic layer may be added or removed. As a result, the second and third stacking faults 141 and 142 may be formed. Stress generated by the second and third stacking faults 141 and 142 may be preserved in the recrystallized lattice. Therefore, each of the second and third stacking faults 141 and 142 may apply stress to the respective channel regions. When the energy used in the PAI process is low or stress induced by the subsequently formed stress films is small, the second and third stacking faults 141 and 142 may not be formed because amorphous regions are small.

Since no stacking fault is formed in the first transistor 100, stress is not applied to the channel region of the first transistor 100. That is, the channel region may be free of stress. Since the second and third stacking faults 141 and 142 may be formed in the channel regions of the second and third transistors 101 and 102, respectively, stress may be applied to the channel regions of the second transistor 101 and the third transistor 102 through the SMT process.

After the second and third stacking faults 141 and 142 are formed, the first through third stress films 170 through 172 may be removed.

A first concentration of the first channel implant region 110 of the first transistor 100 may be different from a third concentration of the third channel implant region 112 of the third transistor 102.

The first concentration of the first channel implant region 110 of the first transistor 100 may be greater than the third concentration of the third channel implant region 112 of the third transistor 102. A second concentration of the second channel implant region 111 of the second transistor 101 may be equal to the first concentration of the first channel implant region 110 of the first transistor 100. The second channel implant region 111 and the first channel implant region 110 may be formed simultaneously.

In summary, stress is applied to the second and third transistors 101 and 102 through the SMT process but stress is not applied to the first transistor 100. The first concentration of the first channel implant region 110 may be equal to the second concentration of the second channel implant region 111, and the third concentration of the third channel implant region 112 may be less than the first concentration or the second concentration.

Accordingly, the first transistor 100, the second transistor 101, and the third transistor 102 may have different threshold voltages. For example, a threshold voltage of the first transistor 100 may be higher than that of the second transistor 101, and the threshold voltage of the second transistor 101 may be higher than that of the third transistor 102. For example, the first transistor 100 may be a regular Vt (RVT) transistor, the second transistor 101 may be a low Vt (LVT) transistor, and the third transistor 102 may be a super low Vt (SLVT) transistor.

A transistor to which stress is applied through the SMT process may show improved performance but reduced threshold voltage. Additionally, a high channel implant concentration may results in an increased threshold voltage. Therefore, transistors having different threshold voltages can be formed on one substrate by selectively applying stress using, for example, the SMT process and adjusting the channel implant concentration.

Figure 2:
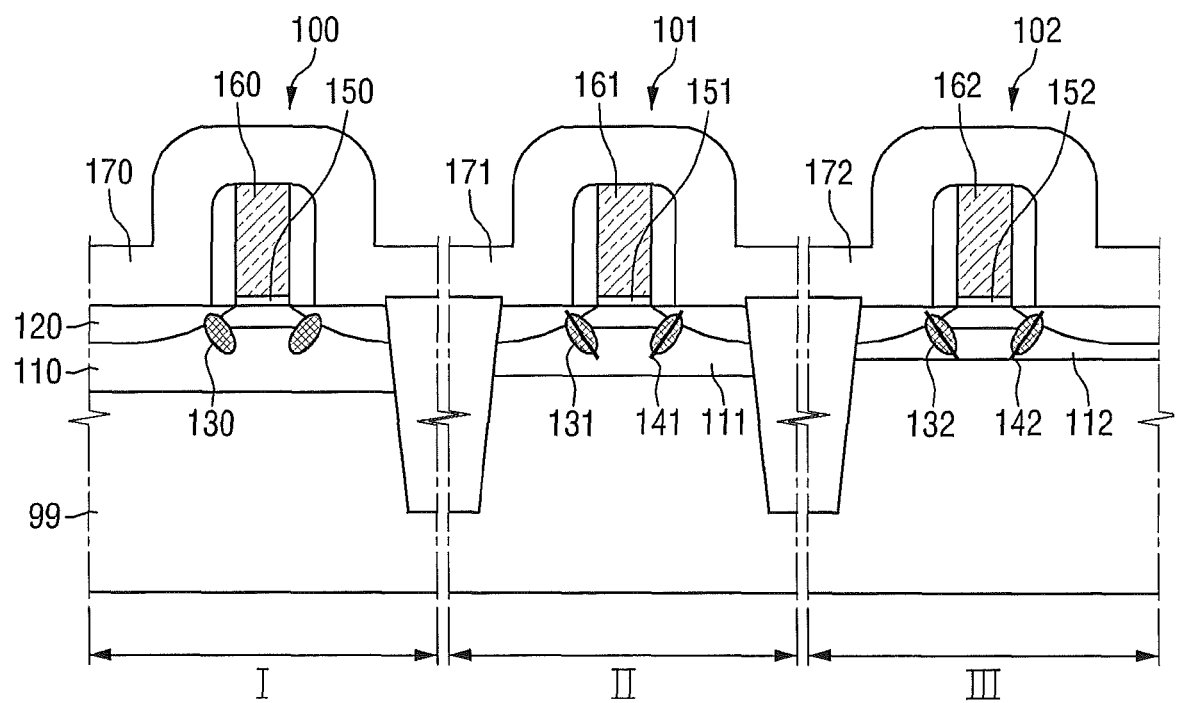
FIG. 2 is a cross-sectional view of a semiconductor device according to some embodiments of the present inventive concept.

FIG. 2 is a cross-sectional view of a semiconductor device according to some embodiments of the present inventive concept.

Referring to FIG. 2, a second concentration of a second channel implant region 111 of a second transistor 101 may be less than a first concentration of a first channel implant region 110 of a first transistor 100. Stress is applied to the second and third transistors 101 and 102 through an SMT process but stress is not applied to the first transistor 100. Therefore, the first transistor 100, the second transistor 101, and the third transistor 102 can have different threshold voltages.

Figure 3:
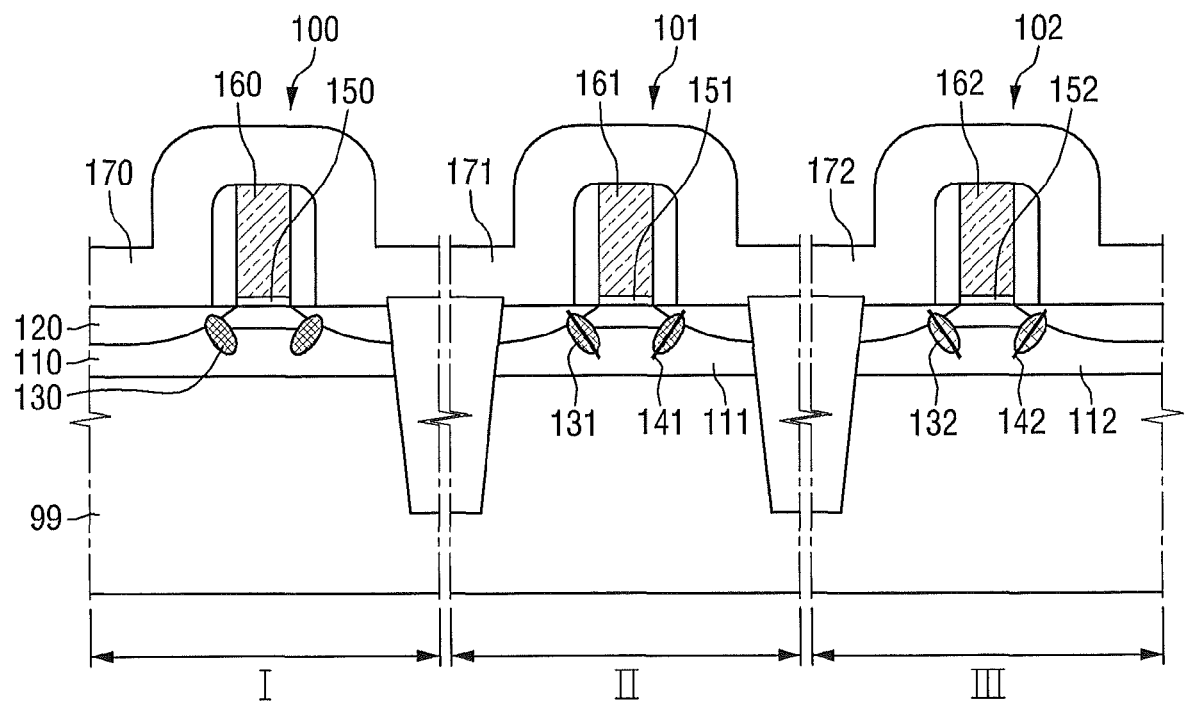
FIG. 3 is a cross-sectional view of a semiconductor device according to some embodiments of the present inventive concept.

FIG. 3 is a cross-sectional view of a semiconductor device according to some embodiments of the present inventive concept.

Referring to FIG. 3, a fourth concentration of a first halo 130 of a first transistor 100 may be different from a sixth concentration of a third halo 132 of a third transistor 102. The fourth concentration of the first halo 130 of the first transistor 100 may be greater than the sixth concentration of the third halo 132 of the third transistor 102. In addition, a fifth concentration of a second halo 131 of a second transistor 101 may be equal to the fourth concentration of the first halo 130 of the first transistor 100.

In addition, stress is applied to the second and third transistors 101 and 102 through an SMT process but stress is not applied to the first transistor 100.

A transistor having high halo concentration may have high threshold voltage. Also, a transistor to which stress is applied through the SMT process may show improved performance but reduced threshold voltage. Therefore, transistors having different threshold voltages can be formed on one substrate by selectively applying stress using, for example, the SMT process and adjusting the halo concentration.

That is, referring to FIG. 3, the first transistor 100, the second transistor 101, and the third transistor 102 may have different threshold voltages by controlling stress and halo concentration.

Figure 4:
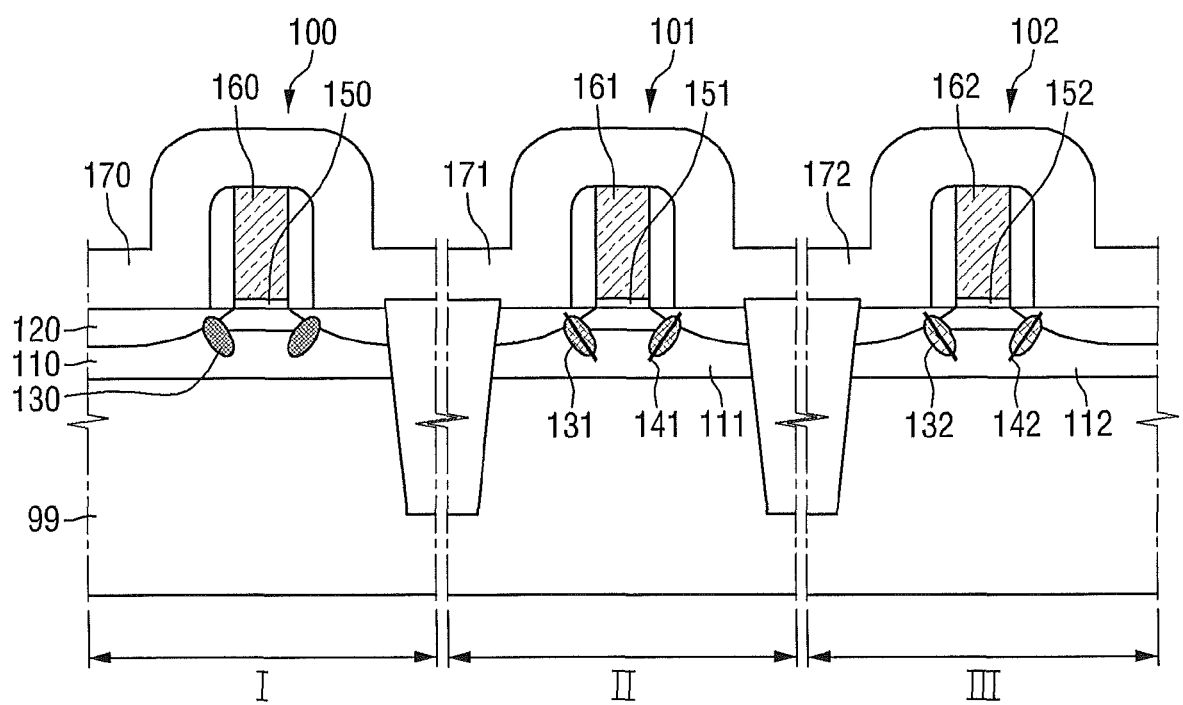
FIG. 4 is a cross-sectional view of a semiconductor device according to some embodiments of the present inventive concept.

FIG. 4 is a cross-sectional view of a semiconductor device according to some embodiments of the present inventive concept.

Referring to FIG. 4, a fifth concentration of a second halo 131 may be less than a fourth concentration of a first halo 130. Stress is applied to the second and third transistors 101 and 102 through an SMT process but stress is not applied to the first transistor 100. The first transistor 100, the second transistor 101, and the third transistor 102 may have different threshold voltages by controlling stress and halo concentration.

Figure 5:
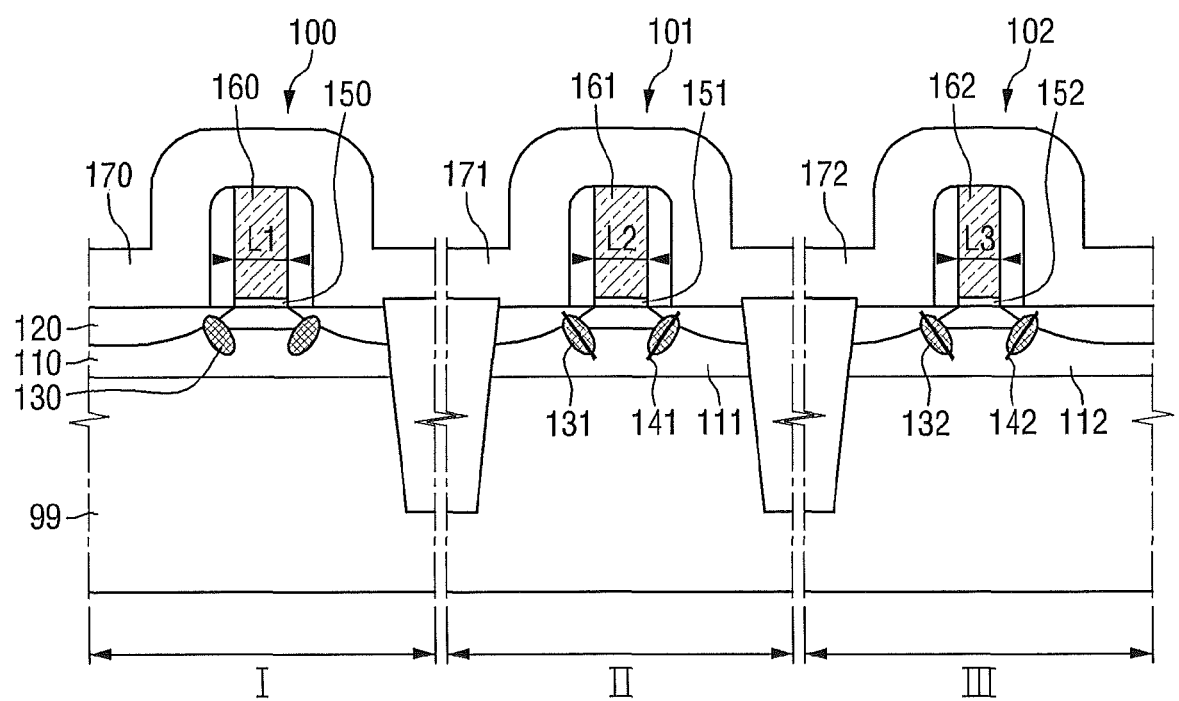
FIG. 5 is a cross-sectional view of a semiconductor device according to some embodiments of the present inventive concept.

FIG. 5 is a cross-sectional view of a semiconductor device according to some embodiments of the present inventive concept.

Referring to FIG. 5, a first length L1 of a first gate electrode 160 of a first transistor 100 may be different from a third length L3 of a third gate electrode 162 of a third transistor 102. The first length L1 of the first gate electrode 160 of the first transistor 100 may be greater than the third length L3 of the third gate electrode 162 of the third transistor 102. A second length L2 of a second gate electrode 161 of a second transistor 101 may be equal to the first length L1 of the first gate electrode 160 of the first transistor 100.

Stress is applied to the second and third transistors 101 and 102 through an SMT process but stress is not applied to the first transistor 100.

A transistor having a longer gate length may have higher threshold voltage. Also, a transistor to which stress is applied through an SMT process may show improved performance but reduced threshold voltage. Therefore, transistors having different threshold voltages can be formed on one substrate by selectively applying stress using, for example, the SMT process and adjusting the gate length.

The first transistor 100, the second transistor 101, and the third transistor 102 may have different threshold voltages by controlling stress and gate length.

Figure 6:
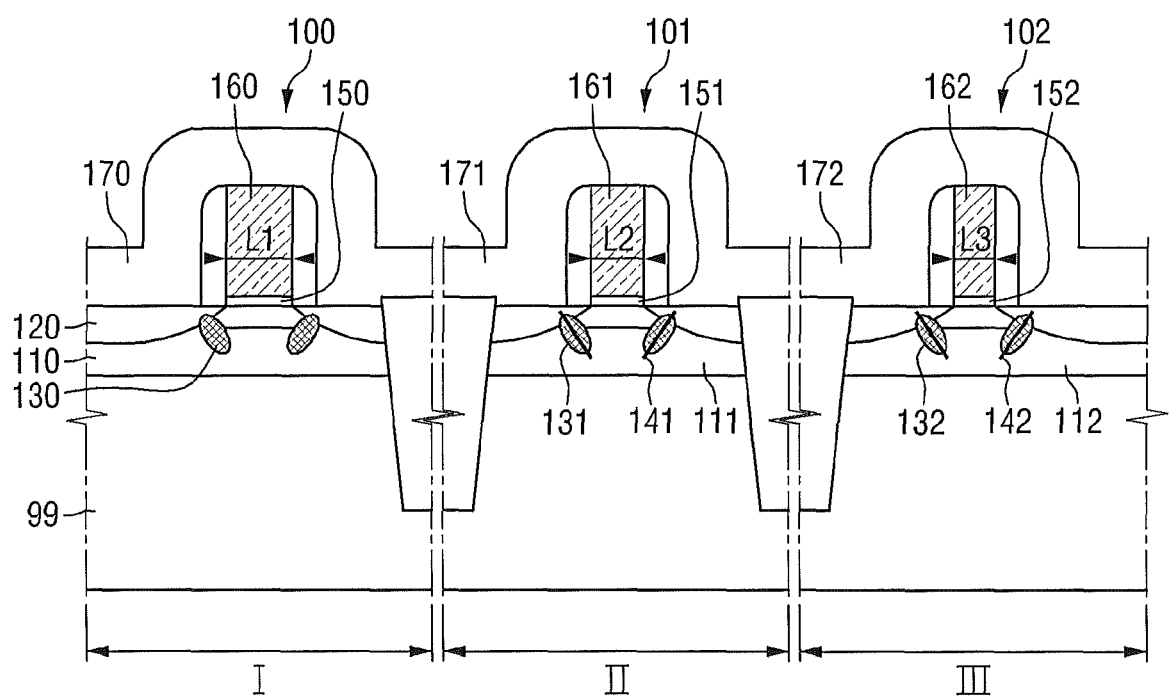
FIG. 6 is a cross-sectional view of a semiconductor device according to some embodiments of the present inventive concept.

FIG. 6 is a cross-sectional view of a semiconductor device according to some embodiments of the present inventive concept.

Referring to FIG. 6, a second length L2 of a second gate electrode 161 of a second transistor 101 may be less than a first length L1 of a first gate electrode 160 of a first transistor 100. Stress is applied to the second and third transistors 101 and 102 through an SMT process but stress is not applied to the first transistor 100. The first transistor 100, the second transistor 101, and the third transistor 102 may have different threshold voltages by controlling stress and gate length.

Figure 7:
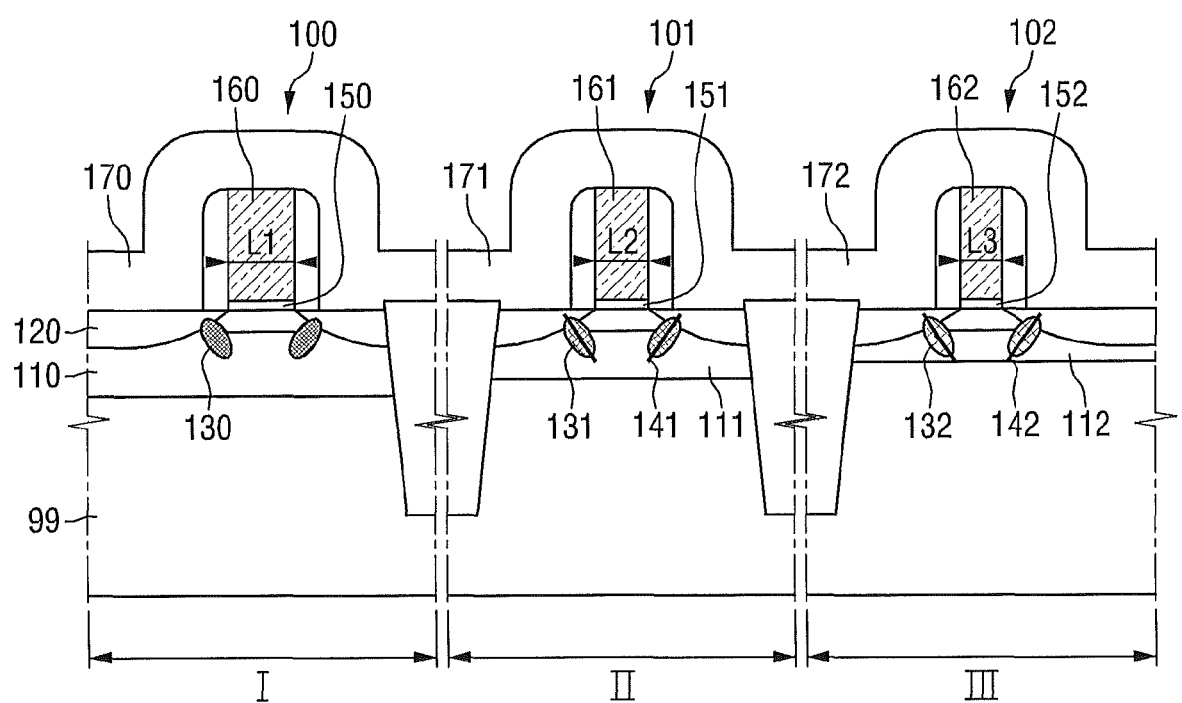
FIG. 7 is a cross-sectional view of a semiconductor device according to some embodiments of the present inventive concept.

FIG. 7 is a cross-sectional view of a semiconductor device according to some embodiments of the present inventive concept.

Referring to FIG. 7, stress is applied to the second and third transistors 101 and 102 through an SMT process but stress is not applied to the first transistor 100.

A second concentration of a second channel implant region 111 of the second transistor 101 may be less than a first concentration of a first channel implant region 110 of the first transistor 100. A third concentration of a third channel implant region 112 of the third transistor 102 may be less than the second concentration of the second channel implant region 111 of the second transistor 101.

A fifth concentration of a second halo 131 may be less than a fourth concentration of a first halo 130. A sixth concentration of a third halo 132 may be less than the fifth concentration of the second halo 131.

A second length L2 of a second gate electrode 161 of the second transistor 101 may be less than a first length L1 of a first gate electrode 160 of the first transistor 100. A third length L3 of a third gate electrode 162 of the third transistor 102 may be less than the second length L2 of the second gate electrode 161 of the second transistor 101.

Therefore, the first transistor 100, the second transistor 101, and the third transistor 102 may have different threshold voltages by controlling stress, channel implant concentrations, halo concentrations, and/or gate lengths.

Figure 8:
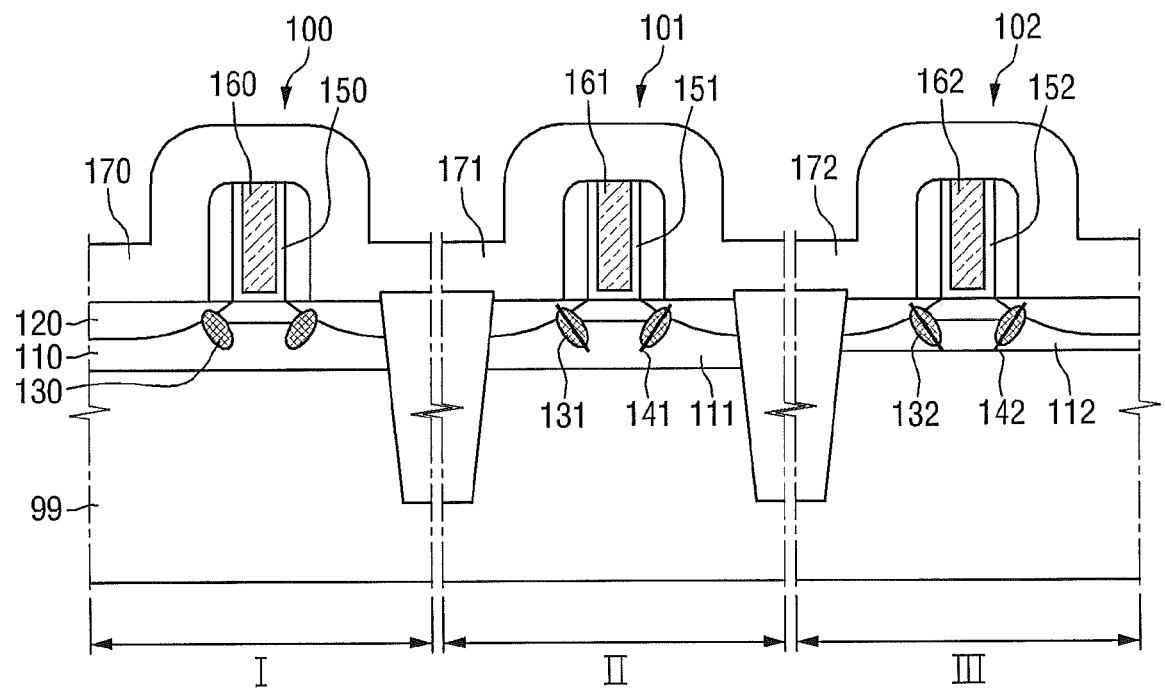
FIG. 8 is a cross-sectional view of a semiconductor device according to some embodiments of the present inventive concept.

FIG. 8 is a cross-sectional view of a semiconductor device according to some embodiments of the present inventive concept.

Referring to FIG. 8, first through third transistors 100 through 102 may have a gate last structure. That is, each of first through third gate insulating films 150 through 152 may be conformally formed along sidewalls and a bottom surface of a trench (that is, may be formed in a 'U' shape), and each of first through third gate electrodes 160 through 162 may be formed to fill the trench. The first through third gate insulating films 150 through 152 may include, for example, a high-k material, and the first through third gate electrodes 160 through 162 may include, for example, a metal.

Figure 9:
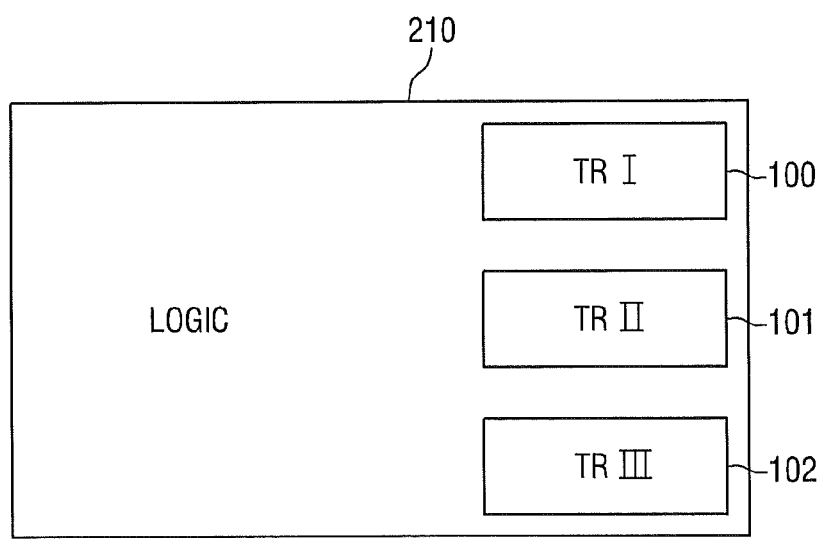
FIG. 9 is a block diagram of a semiconductor device according to some embodiments of the present inventive concept.
Figure 10:
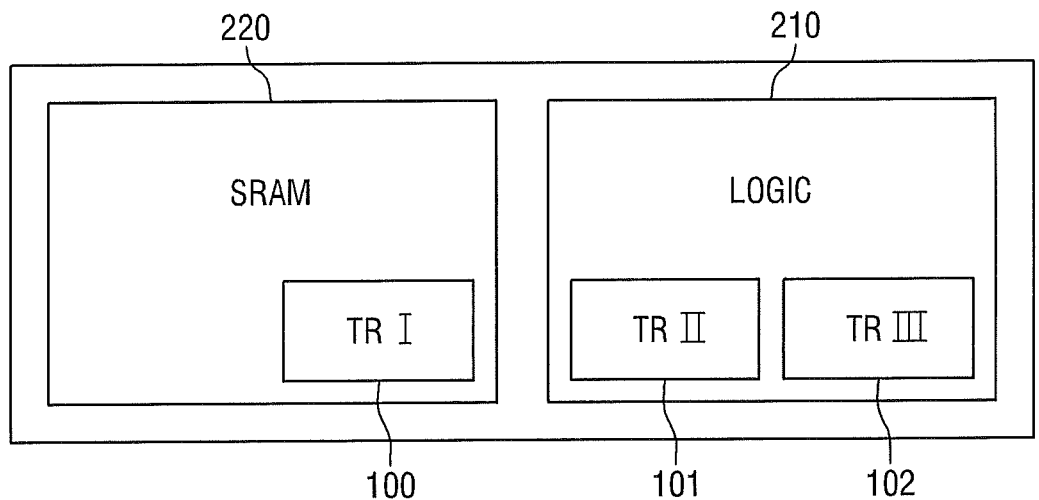
FIG. 10 is a block diagram of a semiconductor device according to some embodiments of the present inventive concept.

FIG. 9 is a block diagram of a semiconductor device according to some embodiments of the present inventive concept. FIG. 10 is a block diagram of a semiconductor device according to some embodiments of the present inventive concept.

Referring to FIG. 9, a first transistor 100, a second transistor 101, and a third transistor 102 having different threshold voltages may be formed in a logic region 210. Each of the first transistor 100, the second transistor 101, and the third transistor 102 may be any one of the semiconductor devices described above with reference to FIGS. 1 through 8.

Referring to FIG. 10, a first transistor 100 formed in an static random access memory (SRAM) region 220 may have a different threshold voltage from those of a second transistor 101 and a third transistor 102 formed in a logic region 210.

According to some embodiments, some (e.g., 101) of the first through third transistors 100 through 102 may be formed in the SRAM region 220, and the other ones (e.g., 100 and 102) may be formed in the logic region 210.

Figure 11:
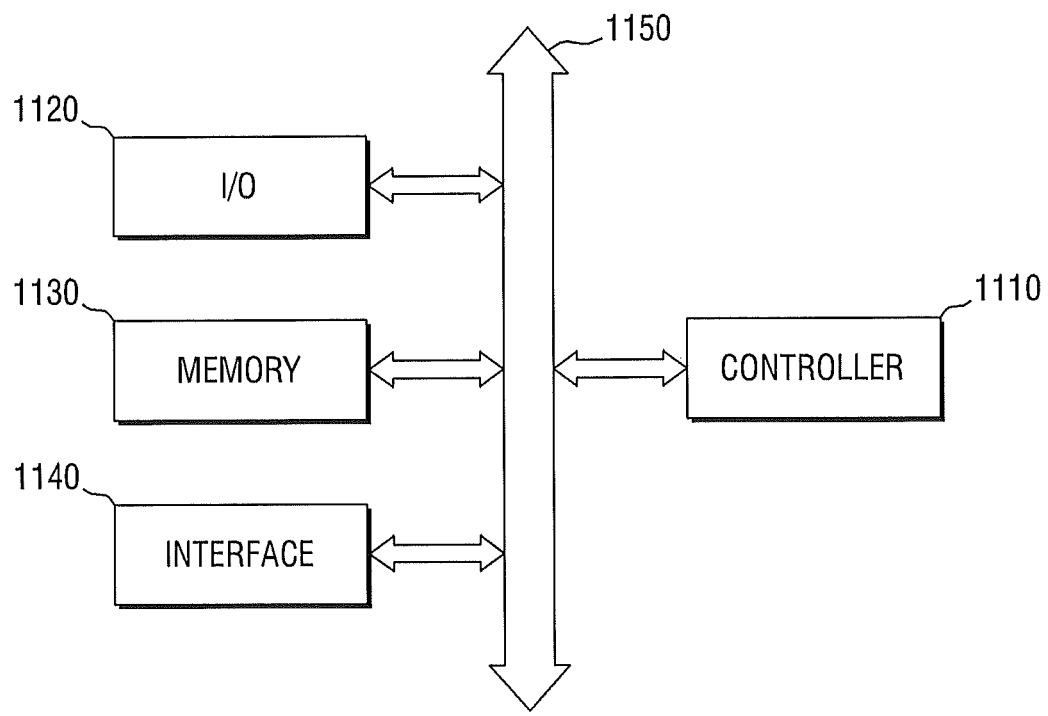
FIG. 11 is a block diagram of an electronic system including a semiconductor device according to some embodiments of the present inventive concept.

FIG. 11 is a block diagram of an electronic system including a semiconductor device according to some embodiments of the present inventive concept.

Referring to FIG. 11, the electronic system 1100 including a semiconductor device according to some embodiments may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 corresponds to a path through which data is transferred.

The controller 1110 may include at least one of a microprocessor, a digital signal processor, a microcontroller, or logic elements capable of performing similar functions to those of the above elements. The I/O device 1120 may include a keypad, a keyboard, and a display device. The memory device 1130 may store data and/or commands. The interface 1140 may transmit data to a communication network or receive data from the communication network. The interface 1140 may be in a wired or wireless form. For example, the interface 1140 may be an antenna or a wired/wireless transceiver. The electronic system 1100 may further include a high-speed dynamic random access memory (DRAM) and/or a high-speed SRAM as an operation memory for improving the operation of the controller 1110.

The electronic system 1100 can be applied to a personal digital assistant (PDA), a portable computer, a web tablet, a wireless phone, a mobile phone, a digital music player, a memory card, and/or any electronic products that can transmit and/or receive information in a wireless environment.

Figure 12:
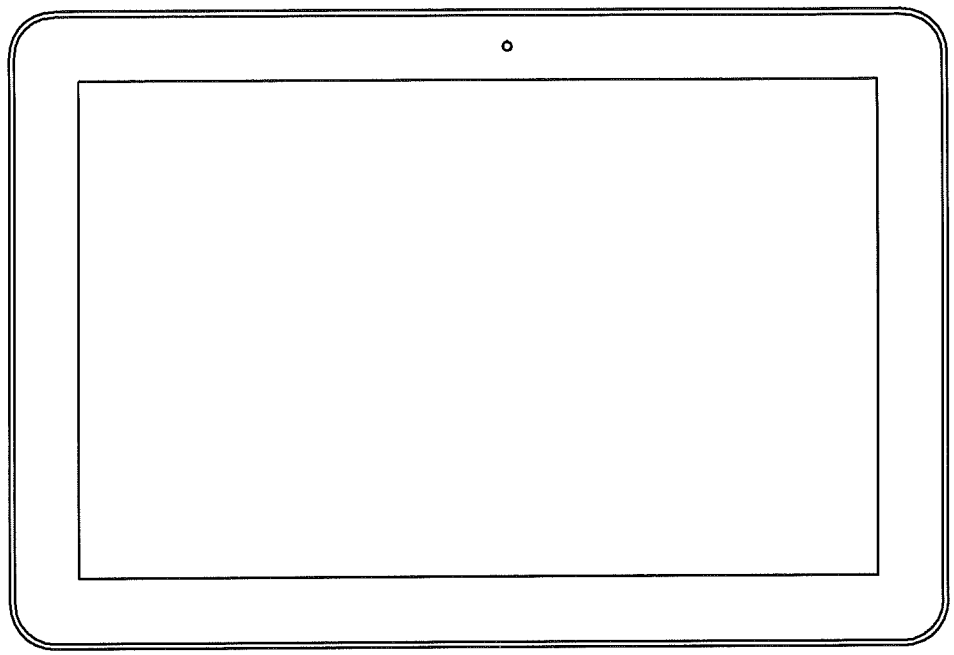
FIGS. 12 and 13 are example systems including a semiconductor device according to some embodiments of the present inventive concept.
Figure 13:
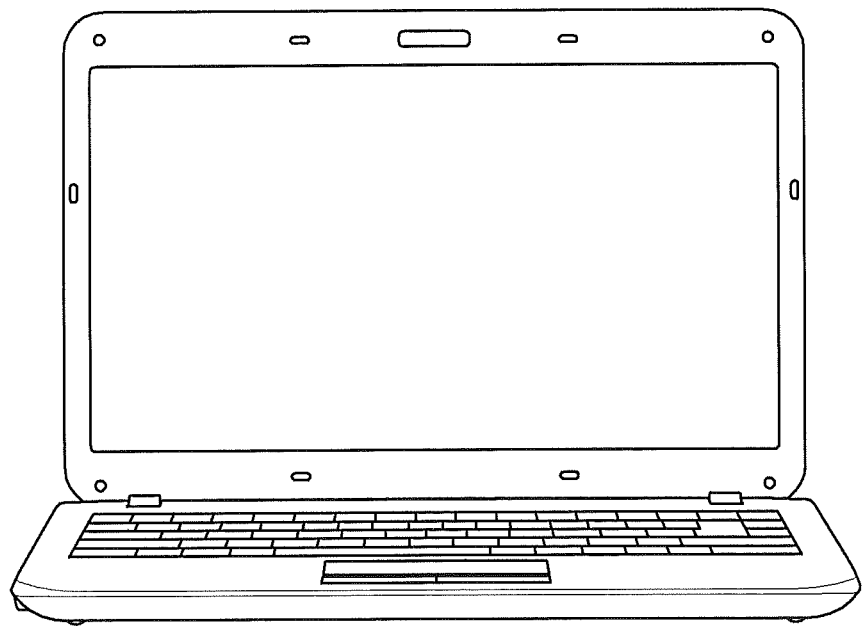

FIGS. 12 and 13 are example systems including a semiconductor device according to some embodiments of the present inventive concept. FIG. 12 shows a tablet PC, and FIG. 13 shows a notebook computer. A semiconductor device according to some embodiments of the present inventive concept can be used in a tablet PC, a notebook computer, and the like. Semiconductor devices according to the embodiments of the present inventive concept are applicable to other integrated circuit devices.

FIGS. 14 through 18 are cross-sectional views of intermediate structures provided as portions of a method of forming a semiconductor device according to some embodiments of the present inventive concept.

Figure 14:
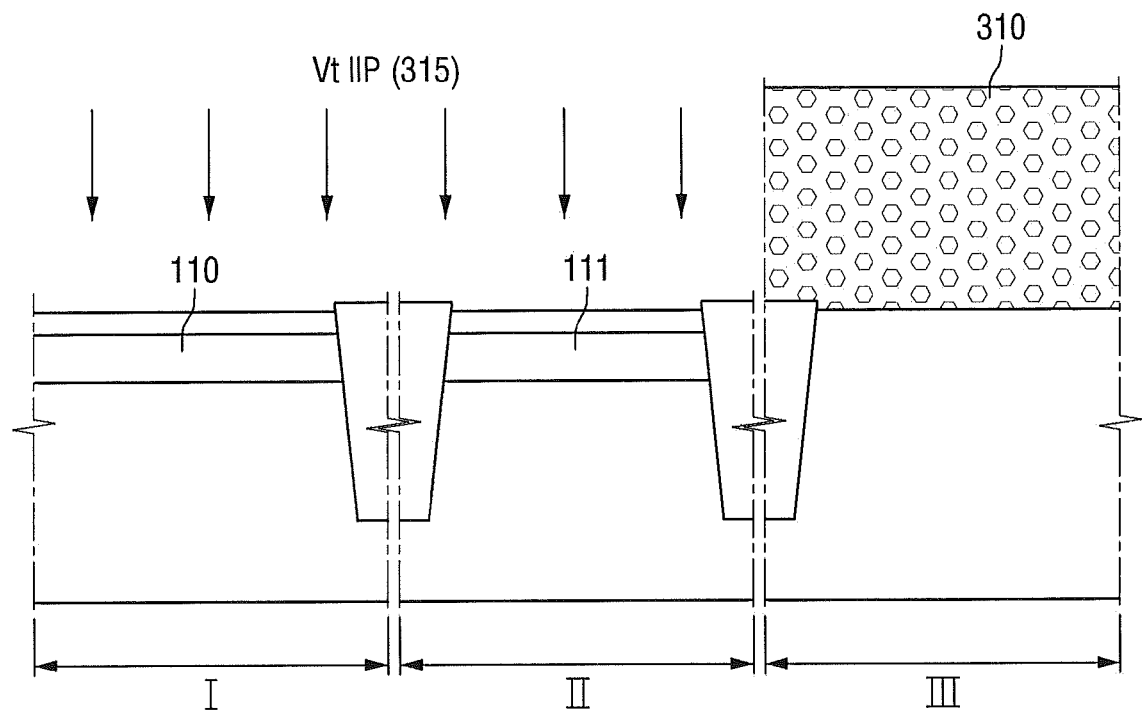
FIGS. 14 through 18 are cross-sectional views of intermediate structures provided as portions of a method of forming a semiconductor device according to some embodiments of the present inventive concept.

Referring to FIG. 14, a substrate 99 including a first region I, a second region II, and a third region III is provided.

A mask pattern 310 which covers the third region III and exposes the first and second regions I and II may be formed. A first channel implantation process 315 may be performed on the first and second regions I and II by implanting impurities at a first dose to form a first channel implant region 110 and a second channel implant region 111 in the first region I and the second region II, respectively.

Figure 15:
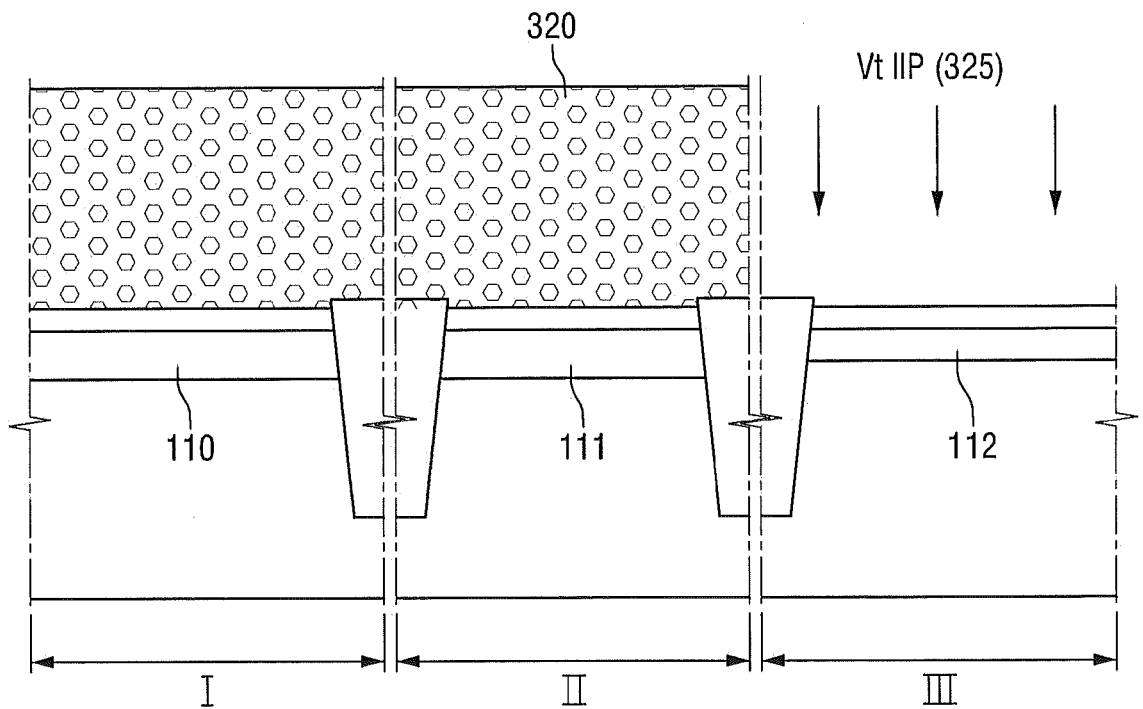

Referring to FIG. 15, a mask pattern 320 which exposes the third region III and covers the first and second regions I and II is formed. A second channel implantation process 325 may be performed on the third region III by implanting impurities at a second dose different from the first dose. The first dose may be greater than the second dose. A third channel implant region 112 is formed in the third region III.

Figure 16:
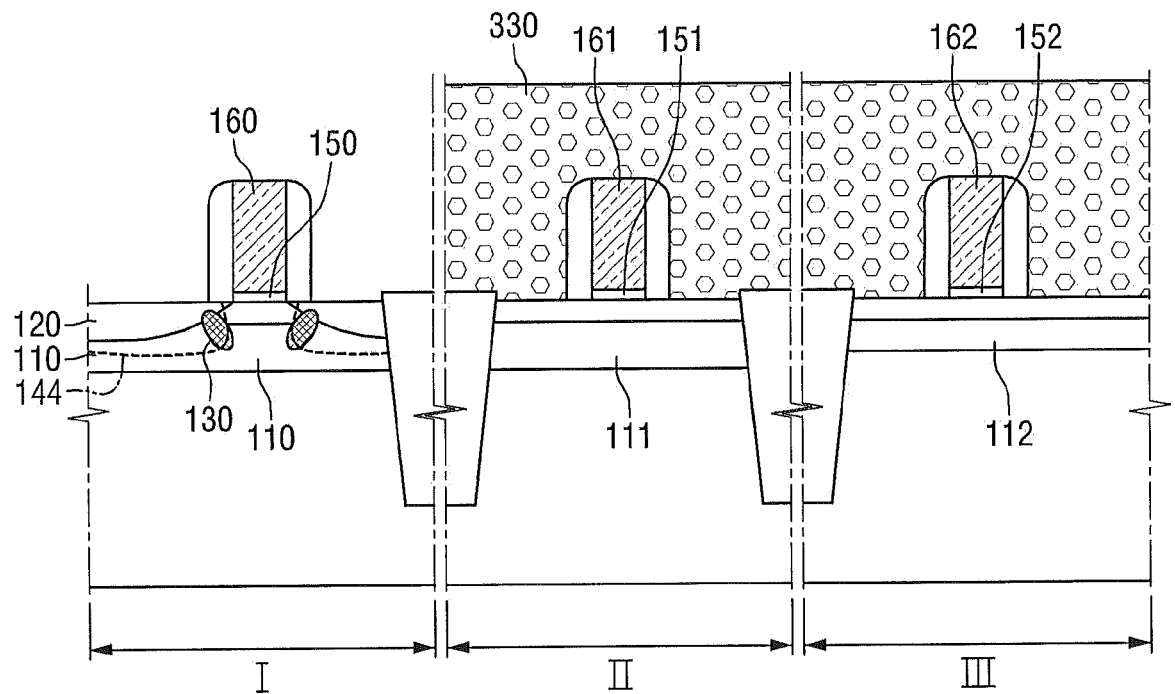

Referring to FIG. 16, first, second and third gate structures are formed in the first through third regions I through III, respectively. The first, second and third gate structures may include first through third gate insulating films 150 through 152 and first through third gate electrodes 160 through 162, respectively.

A mask pattern 330 which covers the second and third regions II and III and exposes the first region I is formed and a first source/drain 120 is formed in the substrate 99 on both sides of the first gate electrode 160.

A first halo 130 may be formed in the substrate 99 on both sides of the first gate electrode 160.

A first pre-amorphization implantation (PAI) process may be performed on the first region I at a first energy. The first PAI process results in the formation of a first amorphous region 144. The PAI process is a process of amorphizing part of the substrate 99 by implanting ions into the substrate 99. The PAI process may use electrically neutral species, for example, Si, Ge, Xe or C.

Figure 17:
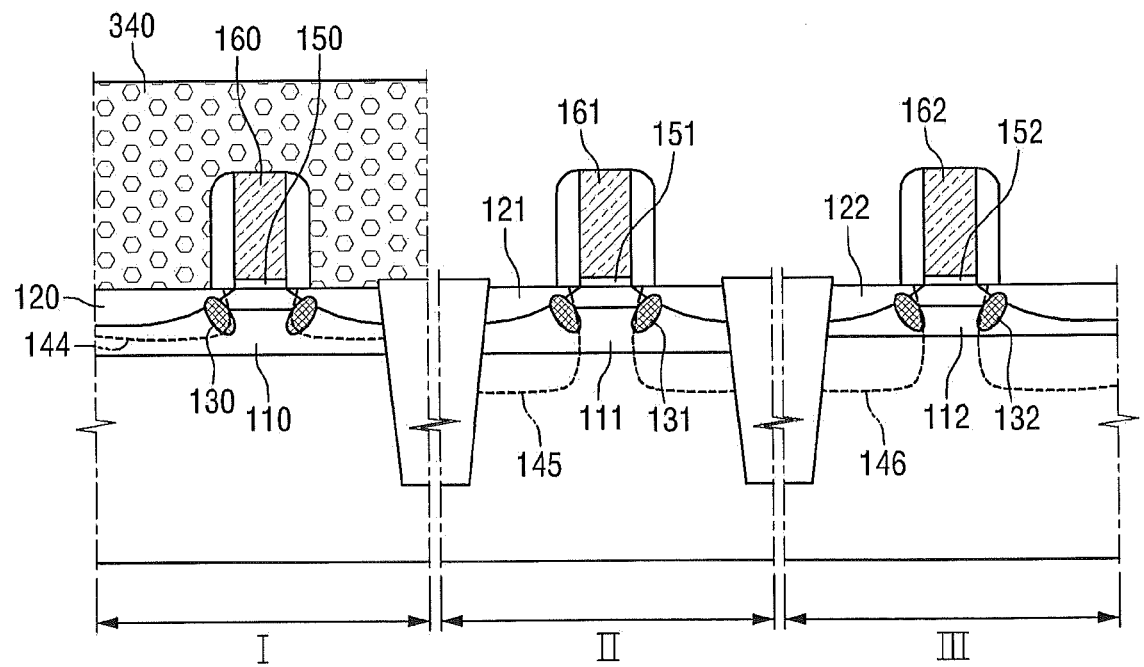

The first PAI process performed on the first region I may be not performed in some embodiments Referring to FIG. 17, a mask pattern 340 which covers the first region I and exposes the second and third regions II and III is formed.

Then, a second source/drain 121 is formed in the substrate 99 on both sides of the second gate electrode 161, and a third source/drain 122 is formed in the substrate 99 on both sides of the third gate electrode 162.

A second halo 131 may be formed in the substrate 99 on both sides of the second gate electrode 161, and a third halo 132 may be formed in the substrate 99 on both sides of the third gate electrode 162.

A second PAI process may be performed on the second and third regions II and III at a second energy different from the first energy. The second PAI process results in the formation of second and third amorphous regions 145 and 146. Here, the second energy may be higher than the first energy. Therefore, the second and third amorphous regions 145 and 146 may be larger than the first amorphous region 144.

Figure 18:
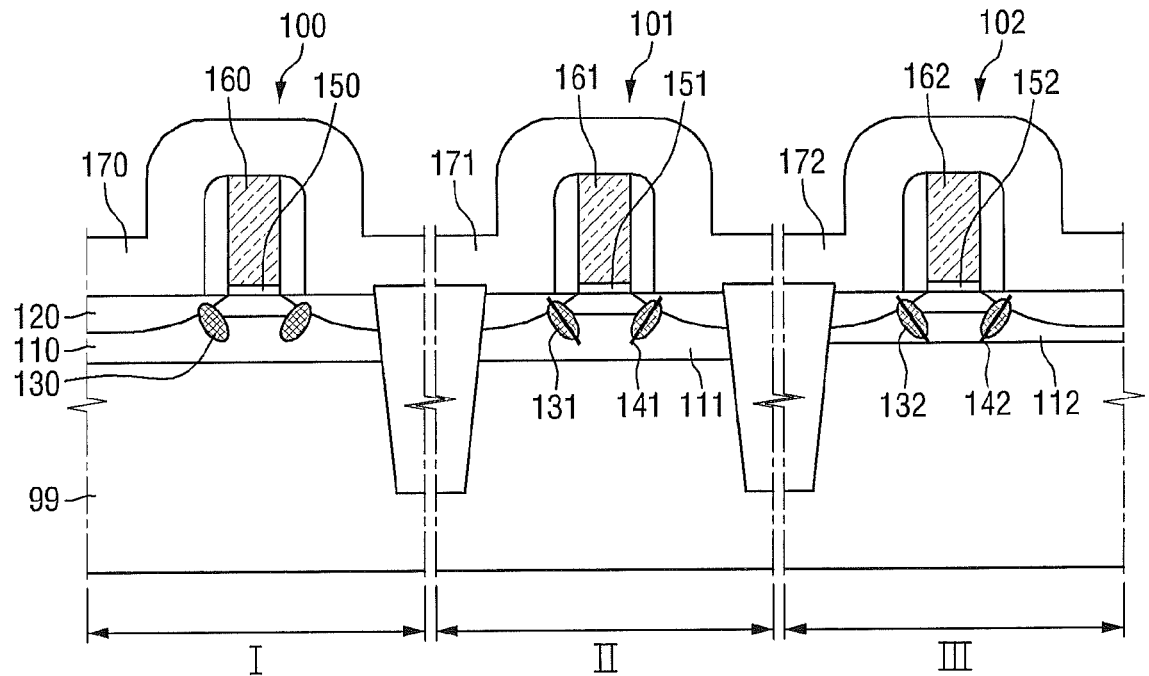

Referring to FIG. 18, first through third stress films 170 through 172 are formed on the first through third regions I through III, respectively.

Then, a heat treatment process may be performed to complete an SMT process. The heat treatment process results in the crystallization of the first through third amorphous regions 144 through 146. In addition, the heat treatment process results in the formation of a second stacking fault 141 and a third stacking fault 142 in the second region II and the third region III, respectively. No stacking fault may be formed in the first region I. Even if stress is applied to the first region I, a stacking fault may not be formed since the first amorphous region 144 is thin. In other words, the amorphous region 144 may be formed to have a thickness that is insufficient to result in a stacking fault based on the stress applied to the first region I.

Figure 19:
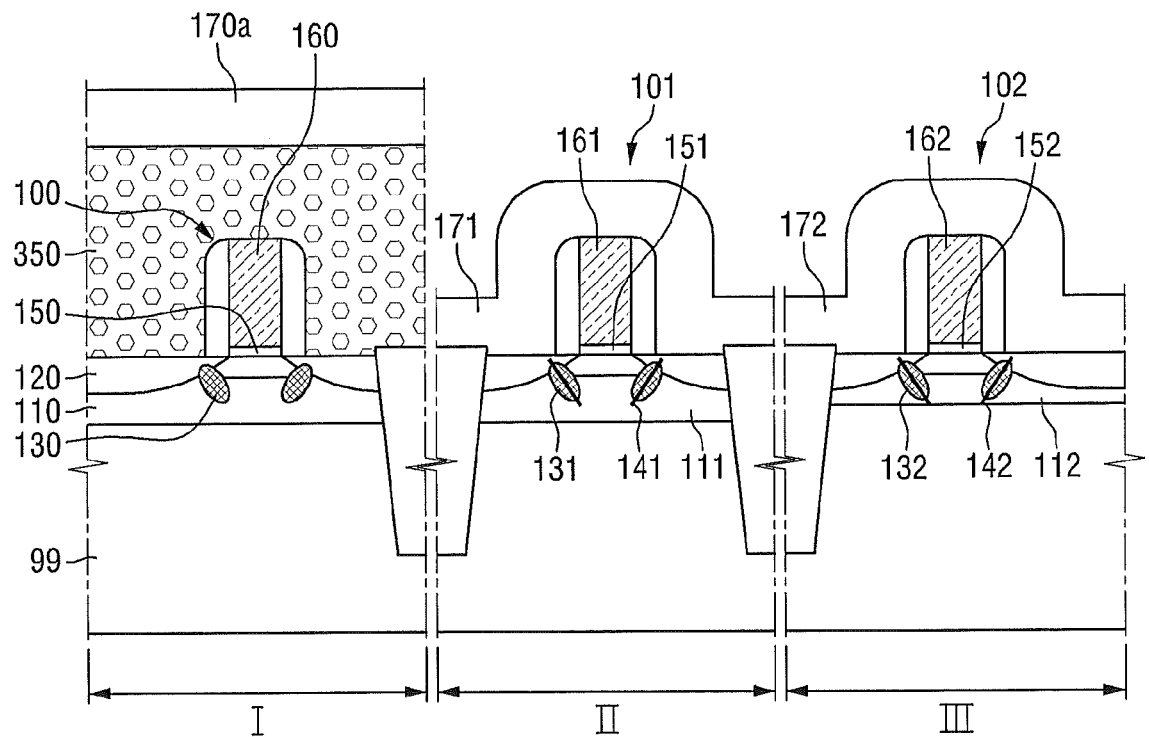
FIG. 19 is a cross-sectional view of an intermediate structure provided as portions of a method of forming a semiconductor device according to some embodiments of the present inventive concept.

FIG. 19 is a cross-sectional view of an intermediate structure provided as portions of a method of forming a semiconductor device according to some embodiments of the present inventive concept. The step illustrated in FIG. 18 may be replaced with the step illustrated in FIG. 19.

After the structure of FIG. 17 is formed, an intervening pattern 350 which covers a first region I and exposes second and third regions II and III may be formed. Then, stress films 170a, 171 and 172 are formed on the first, second and third regions I, II and III, respectively.

A heat treatment process may be performed to complete an SMT process. The heat treatment process results in the formation of a second stacking fault 141 and a third stacking fault 142 in the second region II and the third region III, respectively. No stacking fault may be formed in the first region I. Since the intervening pattern 350 covers the first region I, even if stress is applied to the first region I, a stacking fault may not be formed in the first region I.

Figure 20:
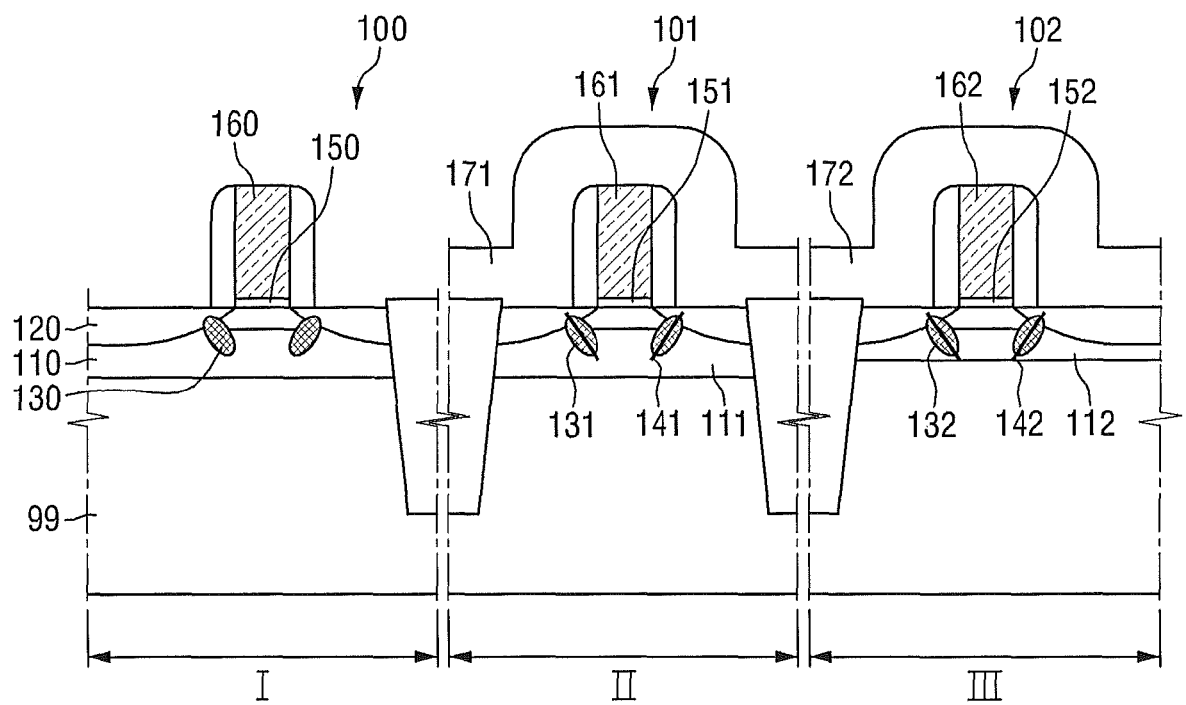
FIG. 20 is a cross-sectional view of an intermediate structure provided as portions of a method of forming a semiconductor device according to some embodiments of the present inventive concept.

FIG. 20 is a cross-sectional view of an intermediate structure provided as portions of a method of forming a semiconductor device according to some embodiments of the present inventive concept. The step illustrated in FIG. 18 may be replaced with the step illustrated in FIG. 20.

After the structure of FIG. 17 is formed, stress films 171 and 172 may be formed on second and third regions II and III, respectively, but stress film is not formed on the first region I. Stress film may be removed from the first region I.

Then, a heat treatment process is performed to complete an SMT process. The heat treatment process results in the formation of a second stacking fault 141 and a third stacking fault 142 in the second region II and the third region III, respectively. Since no stress film is formed on the first region I, a stacking fault may not be formed in the first region I.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
    a first transistor of a first conductivity type, which is free of a stacking fault, on a substrate;
    a second transistor of the first conductivity type, which includes a stacking fault, on the substrate; and
    a third transistor of the first conductivity type on the substrate, wherein an impurity concentration of a channel implant region of the third transistor is different from an impurity concentration of a channel implant region of the first transistor.

2. The semiconductor device of claim 1, wherein the third transistor includes a stacking fault.

3. The semiconductor device of claim 1, wherein the impurity concentration of the channel implant region of the first transistor is greater than the impurity concentration of the channel implant region of the third transistor.

4. The semiconductor device of claim 3, wherein an impurity concentration of a channel implant region of the second transistor is equal to or less than the impurity concentration of the channel implant region of the first transistor.

5. The semiconductor device of claim 1, wherein a concentration of a halo of the first transistor is different from a concentration of a halo of the third transistor.

6. The semiconductor device of claim 5, wherein the concentration of the halo of the first transistor is greater than the concentration of the halo of the third transistor.

7. The semiconductor device of claim 6, wherein a concentration of a halo of the second transistor is equal to or less than the concentration of the halo of the first transistor.

8. The semiconductor device of claim 1, wherein the first, second and third transistors comprise first, second and third gate electrodes respectively, and wherein a length of the first gate electrode is different from a length of the third gate electrode.

9. The semiconductor device of claim 8, wherein the length of the first gate electrode is greater than the length of the third gate electrode.

10. The semiconductor device of claim 9, wherein a length of the second gate electrode is equal to or less than the length of the first gate electrode.

11. The semiconductor device of claim 1, wherein the first transistor, the second transistor, and the third transistor have threshold voltages different from each other.

12. The semiconductor device of claim 11, wherein the threshold voltage of the first transistor is higher than the threshold voltage of the second transistor, which is higher than the threshold voltage of the third transistor.

13. The semiconductor device of claim 1, wherein the stacking fault of the second transistor is disposed adjacent a channel region of the second transistor such that the stacking fault applies stress to the channel region.

14. The semiconductor device of claim 13, wherein:
    the channel region of the second transistor comprises a first channel region, and the stacking fault of the second transistor comprises a first stacking fault that is disposed adjacent the first channel region such that the first stacking fault applies stress to the first channel region; and
    the third transistor includes a second channel region and a second stacking fault that is disposed adjacent the second channel region such that the second stacking fault applies stress to the second channel region.

15. A semiconductor device, comprising
    a first transistor of a first conductivity type, which is free of a stacking fault, on a substrate;
    a second transistor of the first conductivity type, which includes a stacking fault, on the substrate; and
    a third transistor of the first conductivity type on the substrate, wherein a concentration of a halo of the third transistor is different from a concentration of a halo of the first transistor.

16. The semiconductor device of claim 15, wherein the concentration of the halo of the first transistor is greater than the concentration of the halo of the third transistor.

17. The semiconductor device of claim 16, wherein a concentration of a halo of the second transistor is equal to or less than the concentration of the halo of the first transistor.

18. The semiconductor device of claim 15, wherein the stacking fault of the second transistor is disposed adjacent a channel region of the second transistor such that the stacking fault applies stress to the channel region.

19. A semiconductor device, comprising:
    a first transistor of a first conductivity type, wherein the first transistor includes a first pair of source/drain regions and a first channel region between the first pair of source/drain regions, and the first transistor is free of a stacking fault;
    a second transistor of the first conductivity type, wherein the second transistor includes a second pair of source/drain regions and a second channel region between the second pair of source/drain regions, and the second transistor includes a first stacking fault adjacent the second channel region such that the first stacking fault applies stress to the second channel region; and
    a third transistor of the first conductivity type, wherein the third transistor includes a third pair of source/drain regions and a third channel region between the third pair of source/drain regions, the third transistor includes a second stacking fault adjacent the third channel region such that the second stacking fault applies stress to the third channel region, and an impurity concentration of the third channel region is different from an impurity concentration of the first channel region.

20. The semiconductor device of claim 19, wherein:
the first, second and third transistors includes first, second and third gate electrodes, respectively; and
a length of the first gate electrode is different from a length of the third gate electrode.

* * * * *